(12) United States Patent
Kuenen

(10) Patent No.: US 8,760,176 B2
(45) Date of Patent: Jun. 24, 2014

(54) METHODS AND SYSTEMS FOR PRODUCTION TESTING OF DCO CAPACITORS

(75) Inventor: Jeroen Kuenen, Beuningen (NL)

(73) Assignee: St-Ericsson SA, Plan-les-Ouates (CH)

(*) Notice: Subject to any disclaimer, the term of this patent is extended or adjusted under 35 U.S.C. 154(b) by 617 days.

(21) Appl. No.: 13/111,295

(22) Filed: May 19, 2011

(65) Prior Publication Data

US 2012/0112768 A1    May 10, 2012

Related U.S. Application Data

(60) Provisional application No. 61/412,259, filed on Nov. 10, 2010.

(51) Int. Cl.
| | | |
|---|---|---|
| *G01R 27/32* | (2006.01) | |
| *G01R 27/04* | (2006.01) | |
| *G01R 23/00* | (2006.01) | |
| *G01R 23/09* | (2006.01) | |

(52) U.S. Cl.
CPC .............. *G01R 23/00* (2013.01); *G01R 23/09* (2013.01); *G01R 27/32* (2013.01); *G01R 27/04* (2013.01)
USPC ............ 324/647; 324/76.11; 324/91; 324/84; 324/86; 324/90; 324/76.82; 324/76.66; 324/76.79; 324/76.81; 324/665; 324/679; 324/672; 327/111; 327/156; 327/157; 327/159

(58) Field of Classification Search
CPC ........ G01R 23/00; G01R 23/09; G01R 27/32; G01R 27/04
USPC ................ 324/76.11–91, 647, 665, 679, 672; 327/111, 156, 157, 159
See application file for complete search history.

(56) References Cited

U.S. PATENT DOCUMENTS

| 4,875,400 | A | * | 10/1989 | Okuda et al. .................... 84/626 |
|---|---|---|---|---|
| 5,479,449 | A | * | 12/1995 | Patel et al. ..................... 375/316 |
| 5,548,617 | A | * | 8/1996 | Patel et al. ..................... 375/316 |
| 5,649,320 | A | * | 7/1997 | Korhonen et al. .......... 455/196.1 |

(Continued)

FOREIGN PATENT DOCUMENTS

WO    2008/027710 A2    3/2008

OTHER PUBLICATIONS

International Search Report in corresponding International Application No. PCT/EP2011/069852 mailed Jan. 30, 2012.

(Continued)

*Primary Examiner* — Patrick Assouad
*Assistant Examiner* — Lamarr Brown
(74) *Attorney, Agent, or Firm* — Patent Portfolio Builders PLLC

(57) ABSTRACT

Systems provide for a test system for capacitors in a digitally controllable oscillator (DCO). The system includes: capacitor toggling logic configured to switch on and off a selected one of the capacitors at a modulation frequency; a tone generator configured to generate a tone; a mixer configured to receive the tone and an output carrier signal from the DCO while the capacitor toggling logic is switching the selected one of the capacitors on and off and to output an intermediate frequency signal having FM sidebands based on the modulation frequency and relative capacitor size; and an evaluation circuit configured to evaluate a frequency deviation associated with the selected one of the capacitors based on at least one of the FM sidebands.

20 Claims, 3 Drawing Sheets

(56) References Cited

U.S. PATENT DOCUMENTS

| | | | |
|---|---|---|---|
| 5,659,372 A * | 8/1997 | Patel et al. | 348/731 |
| 5,731,848 A * | 3/1998 | Patel et al. | 348/614 |
| 6,381,265 B1 * | 4/2002 | Hessel et al. | 375/219 |
| 6,799,020 B1 * | 9/2004 | Heidmann et al. | 455/103 |
| 7,071,773 B2 * | 7/2006 | Kuhn et al. | 329/325 |
| 7,098,709 B2 * | 8/2006 | Ido et al. | 327/156 |
| 7,113,757 B2 * | 9/2006 | Chu et al. | 455/127.1 |
| 7,129,714 B2 * | 10/2006 | Baxter | 324/678 |
| 8,203,363 B2 * | 6/2012 | Huang | 327/47 |
| 8,363,703 B2 * | 1/2013 | Ganger et al. | 375/215 |
| 8,446,144 B2 * | 5/2013 | Kuniie et al. | 324/76.23 |
| 2001/0050550 A1 * | 12/2001 | Yoshida et al. | 324/76.53 |
| 2003/0162514 A1 * | 8/2003 | Chu et al. | 455/127 |
| 2004/0146132 A1 | 7/2004 | Staszewski et al. | |
| 2005/0020226 A1 * | 1/2005 | Mohindra | 455/232.1 |
| 2005/0123036 A1 * | 6/2005 | Rahman et al. | 375/240 |
| 2006/0017498 A1 * | 1/2006 | Kuhn et al. | 329/347 |
| 2007/0030080 A1 * | 2/2007 | Han et al. | 331/18 |
| 2007/0085621 A1 | 4/2007 | Staszewski et al. | |
| 2007/0182496 A1 | 8/2007 | Wallberg et al. | |
| 2007/0188244 A1 | 8/2007 | Waheed et al. | |
| 2007/0200638 A1 * | 8/2007 | Sandner et al. | 331/16 |
| 2008/0055014 A1 * | 3/2008 | Tsfaty | 332/127 |
| 2008/0068108 A1 | 3/2008 | Stevenson et al. | |
| 2008/0220730 A1 * | 9/2008 | Borremans | 455/101 |
| 2009/0058468 A1 * | 3/2009 | Hjelm et al. | 327/40 |
| 2009/0115396 A1 * | 5/2009 | Allen et al. | 324/76.25 |
| 2009/0128123 A1 * | 5/2009 | Stein et al. | 324/76.19 |
| 2009/0302958 A1 | 12/2009 | Sakurai et al. | |
| 2010/0134195 A1 * | 6/2010 | Lee et al. | 331/117 FE |
| 2010/0219865 A1 * | 9/2010 | Huang | 327/102 |
| 2010/0259284 A1 * | 10/2010 | Winkens | 324/679 |
| 2011/0102047 A1 * | 5/2011 | Sun et al. | 327/306 |
| 2011/0215848 A1 * | 9/2011 | Koroglu et al. | 327/157 |
| 2011/0304318 A1 * | 12/2011 | Noujeim et al. | 324/76.24 |
| 2012/0068743 A1 * | 3/2012 | Youssef et al. | 327/156 |
| 2012/0105049 A1 * | 5/2012 | Ortler et al. | 324/76.39 |
| 2012/0105051 A1 * | 5/2012 | Furtner | 324/123 R |
| 2013/0147496 A1 * | 6/2013 | Moedl et al. | 324/679 |

OTHER PUBLICATIONS

Oren Eliezer, et al.; "A Built-In Tester for Modulation Noise in a Wireless Transmitter"; Wireless Terminals Business Unit, Texas Instruments; IEEE, 2006; pp. 1-4; Dallas, Texas.

* cited by examiner

METHODS AND SYSTEMS FOR PRODUCTION TESTING OF DCO CAPACITORS

RELATED APPLICATION

This non-provisional patent application is related to, and claims priority based upon, U.S. Provisional Patent Application Ser. No. 61/412,259, filed on Nov. 10, 2010, entitled "Methods and Systems for Production Testing of DCO Capacitors", the disclosure of which is expressly incorporated here by reference.

TECHNICAL FIELD

The present invention relates generally to capacitors and more specifically to testing systems and methods associated with production of DCO capacitors.

BACKGROUND

Ongoing technological developments have led to an increasing number of electronic and electrical devices, e.g., cell phones, which use and need the support of timing technologies. Phase locked loops (PLLs) found in integrated circuits are used in signal processing and synchronizing applications in support of these timing needs. A phase locked loop typically includes an oscillator and a phase detector for comparing the phases of two signals. Various forms of phase locked loops have been used over time for this purpose, including a digital phase locked loop (DPLL) which includes a digital controllable oscillator (DCO).

For transmitters with a polar and highly digitized architecture, a DCO can be used to generate the phase modulation (PM). To generate a transmitter (TX) signal with sufficient quality (e.g., low EVM and low spectral mask) the accuracy of the DCO frequency versus settings should be very good, e.g., the steps size should be approximately linear, e.g., for Bluetooth (BT) typically within a few percent.

The DCO can be tested on a production tester (ATE) to guarantee a good modulation quality before shipment to the customer. The area covered by the DCO including its quantity of capacitors is significant and therefore chances of structural errors are normally considered to be too high to leave it untested. The quality of the modulated signal can, for instance, be measured to test the quality of the DCO. However, there are at least two problems associated with this method. First, the measurement takes a relatively long time since many different sequences of test symbols are needed to get a good average of the signal quality (EVM). Secondly, the measurement is relatively complex to implement on a tester, since a complete demodulation algorithm needs to be build in the tester.

Alternatively the DCO can be tested with a simpler method, i.e., measuring of the frequency of the DCO over all settings. However, the change in frequency is relatively small (approx 40 ppm) so an even higher accuracy is normally needed to test the linearity of the steps, which requires relatively long measurement times.

Accordingly, it would be desirable to provide new testing systems and methods for DCO capacitors which avoid or reduce the above described drawbacks.

SUMMARY

Exemplary embodiments describe methods and systems for testing the capacitors within a digital controlled oscillator (DCO). By using the exemplary embodiments, the testing time can be reduced as compared to conventional testing methods.

According to an exemplary embodiment there is a test system for capacitors in a digitally controllable oscillator (DCO). The test system includes: capacitor toggling logic configured to switch on and off a selected one of the capacitors at a modulation frequency; and a tone generator configured to generate a tone. The test system also includes a mixer configured to receive the tone and an output carrier signal from the DCO while the capacitor toggling logic is switching the selected one of the capacitors on and off, to output an intermediate frequency signal having FM sidebands based on the modulation frequency; and an evaluation circuit configured to evaluate a frequency deviation associated with the selected one of the capacitors based on at least one of the FM sidebands.

The modulation frequency of the test system can be generated by using a frequency source which is independent of the DCO. The selected one of the capacitors can be switched on and off when conditions of an XOR gate and an AND gate are met. Selecting of the first capacitor can be performed by a decoder. Additionally, the modulation frequency can be selected such that a measured FM sideband value is approximately −20 dBc.

According to another exemplary embodiment there is a method for testing a plurality of capacitors within a digital controllable oscillator (DCO). The method includes: selecting a first capacitor of the plurality of capacitors to be tested; and generating a carrier signal from the DCO while switching the first capacitor on and off at a modulation frequency. The method also includes mixing the carrier signal from the DCO with a test signal to generate an intermediate frequency (IF) signal; and determining a relative sideband level associated with a frequency modulated (FM) IF signal.

The method can also include generating the modulation frequency by dividing a frequency of the DCO by a divider, deselecting the first capacitor and selecting a second capacitor, wherein when the second capacitor has a different capacitance from the first capacitor the value of the divider can be changed such that the FM sideband level remains substantially unchanged. The method can also include generating the modulation frequency using a frequency source which can be independent of the DCO, wherein the selected first capacitor can be switched on and off when conditions of an XOR gate and an AND gate are met. Additionally, selecting of the first capacitor can be performed by a decoder and the modulation frequency can be selected such that a measured FM sideband value is approximately −20 dBc.

According to another exemplary embodiment there is a digital controllable oscillator (DCO) manufactured by the process including the steps of: selecting a first capacitor of the plurality of capacitors to be tested; generating an output signal from the DCO associated with the first capacitor; mixing the output signal from the DCO with a test signal; and evaluating a frequency deviation of a frequency modulated (FM) sideband of the first capacitor.

Wherein the process can also include: generating the modulation frequency by dividing a frequency of the DCO by a divider, deselecting the first capacitor; and selecting a second capacitor, wherein when the second capacitor has a different capacitance from the first capacitor the value of the divider can be changed such that the FM sideband level remains substantially unchanged. Wherein the process can also include: generating the modulation frequency using a frequency source which can be independent of the DCO. The selected first capacitor can be switched on and off when conditions of an XOR gate and an AND gate are met. Selecting of the first capacitor can be performed by a decoder.

BRIEF DESCRIPTION OF THE DRAWINGS

The accompanying drawings illustrate exemplary embodiments, wherein.

DETAILED DESCRIPTION

The following detailed description of the exemplary embodiments refers to the accompanying drawings. The same reference numbers in different drawings identify the same or similar elements. Additionally, the drawings are not necessarily drawn to scale. Also, the following detailed description does not limit the invention. Instead, the scope of the invention is defined by the appended claims.

Reference throughout the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

As described in the background section various conventional methods for testing the capacitors of a digital controllable oscillator (DCO) can be relatively lengthy and complex. Exemplary systems and methods for testing DCOs according to embodiments of the present invention are described below.

According to exemplary embodiments, the DCO controls its frequency by switching in or out capacitors to the, frequency determining, inductor capacitor (LC) tank. The DCO can include, for example, multiple banks of different sized capacitors with a quantity of, for example, 100 capacitors. To measure the frequency step induced by one of those capacitors, the capacitor can be switched on and off, at a certain modulation frequency $f_m$. Due to FM modulation, a sideband appears at the harmonics of $f_m$. The level of the first sideband, relative to the main tone, is ($A_{SB}$):

$$\beta_{fm} = \frac{\Delta f}{2 f_m}, = modulation\, index \quad (1)$$

$$A_{SB} = \frac{\beta_{fm}}{2}$$

where $\Delta f$ is the amount of frequency deviation induced by the capacitor.

The above formula is approximately correct under the condition of small band FM, which can be accomplished by selecting $f_m$ larger than $\Delta f$. Exemplary embodiments operate under the assumption of small band FM since it simplifies matters, but this is not a requirement of exemplary embodiments. According to exemplary embodiments, by selecting the proper $f_m$, the expected sideband can be made to be around –20 dBc, which sideband can be quickly and accurately measured with internal circuitry.

Figure 1:
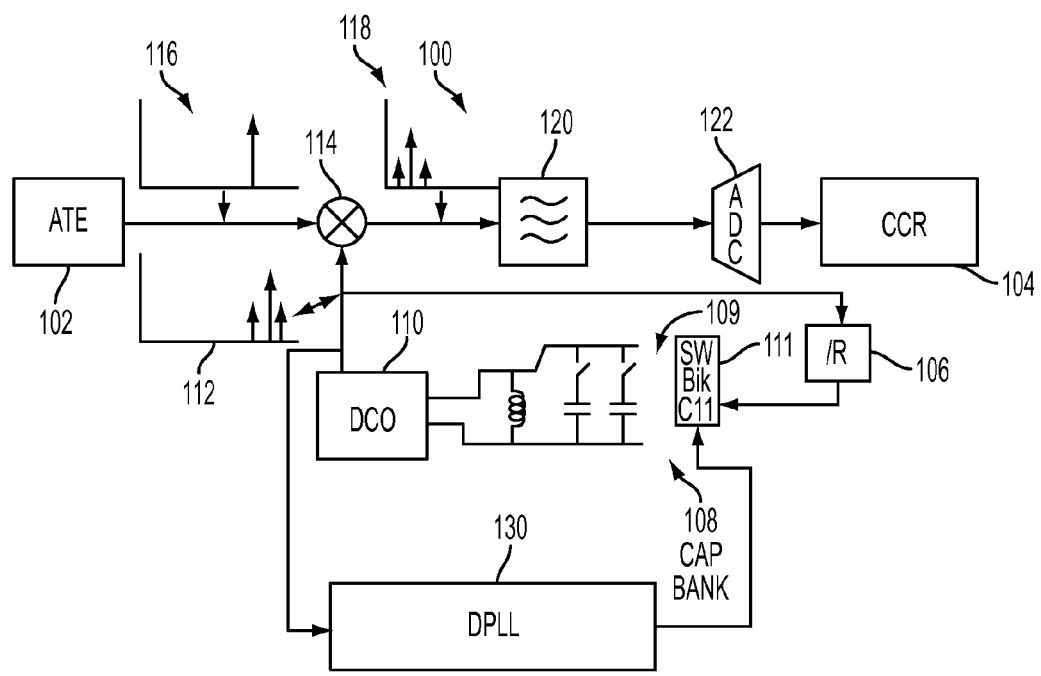
FIG. 1 illustrates a measurement setup according to an exemplary embodiment.

An exemplary configuration for measuring these FM sidebands is illustrated in FIG. 1. Therein, a receiver (RX) 100, which can be a Bluetooth RX, a global system for mobile communications (GSM) RX, a wireless local area network (WLAN) RX, etc., is shown connected to test equipment (ATE) 102, with the addition of a cross-correlator (CCR) 104 and a divider /R 106. One of the capacitors in the capacitor bank 108 is toggled, for example, with the signal generated by the divider /R 106 (or another low frequency source) and switches 109. Switch bank control 111 is discussed in more detail below with respect to FIG. 2. Toggling of the capacitor in bank 108 causes two sidebands to arise around the carrier frequency generated by the DCO 110, (assuming relatively small band FM) as conceptually illustrated by graph 112. This signal is mixed down to an intermediate frequency (IF) band 118 by means of the RX mixer 114 and the CW tone 116 coming from the ATE 102. Normal signal processing of the IF band 118 by the receiver of interest, e.g., by filter 120 and the analog to digital converter (ADC) 122, brings the signal to the CCR 104. Here the levels of the main tone and one of the sidebands are measured. Note that this can be a relative measurement, as compared to an absolute measurement, such that RX 100 gain errors can be eliminated from the measurement.

Thus, according to exemplary embodiments, the ATE 102 generates a continuous wave (CW) tone 116, which is down converted with the FM modulated signal from the DCO 110. So at the IF there are three tones, i.e., the ATE 102 tone with the two sidebands coming from the FM modulation. In the CCR 104, the level of the main tone and its side band are measured. The ratio between the two levels indicates the size of the capacitor in bank 108 which was toggled (switched).

Looking again at equation (1), it can be seen, according to exemplary embodiments, that the side band level does not directly depend on the DCO 110 frequency, only on the ratio between $\Delta f$ and the modulation frequency $f_m$. This characteristic of using FM sidebands to measure the capacitors, even a very small capacitor of a few aF that gives only a 10 kHz frequency deviation on 6 GHz, can result in a FM sideband of –18 dBc by selecting the modulation frequency $f_m$=20 kHz. According to an exemplary embodiment, the modulation frequency $f_m$ can be controlled by making the modulation frequency $f_m$ a function of the DCO 110 frequency and the divider /R 106 as shown in equation 2.

$$f_m = DCO_{freq}/divider/R_{freq} \quad (2)$$

For different sized capacitors, the frequency of divider /R 106 can be changed by logic associated with the divider /R 106. Additionally, to reduce the time to test each capacitor, different $f_m$ values can be used while still maintaining an acceptable FM sideband from a measurement point of view. The FM sideband level depends upon the following three items: (1) required accuracy of the capacitor measurement, (2) noise level in the measurement band, and (3) allowed measurement time. According to exemplary embodiments, a sideband level can approximately be in a range between –10 dBc and –50 dBc. This sideband level can comfortably be measured. With the above measurement, the frequency deviation that one capacitor introduces is measured, and not the absolute value of the capacitor. Alternatively, this absolute value could be calculated if the total capacitance value is known. However, the functionality of the DCO 110 and the DPLL 130 is assured when the frequency steps can be measured.

Considering the sideband level and the three items which can affect it in more detail, noise level on the measurement provides an uncertainty on the measurement results. For an exemplary BT system, there can be a target accuracy which is better than 2% with a change of an erroneous measurement of 1 ppm. The measurement bandwidth is determined by the CCR 104 as shown in equation (2):

$$N_{bw}=1/T_{meas} \quad (2)$$

where $T_{meas}$ is the integration time. A shortest integration time is one cycle of $f_m$. The noise bandwidth cannot become larger than that of the IF strip of the receiver, e.g., 1 MHz. The amount of noise also depends upon the noise generation in the ATE 102, the RX 100 and phase noise of the DPLL 130.

At a given capacitor with a certain Δf, selecting a higher $f_m$ results in a shorter measurement time, assuming the CCR 104 integrates one cycle of Fm while decreasing the sideband level. The SNR becomes worse, i.e., the noise level goes up due to larger measurement bandwidth of the CCR 104 and the sideband level goes down. According to exemplary embodiments, if the SNR becomes too low to meet the desired accuracy requirements two things can be done to obtain a more desirable SNR. First the $f_m$ can be decreased and secondly let the CCR integrate over multiple cycles of $f_m$. Decreasing the $f_m$ is typically more effective as both the sideband level goes up and the noise bandwidth of the CCR is reduced. Regarding the allowed measurement time, the measurement time is determined by the integration length of the CCR 104, e.g., at least one cycle of FM or multiple cycles.

Figure 2:
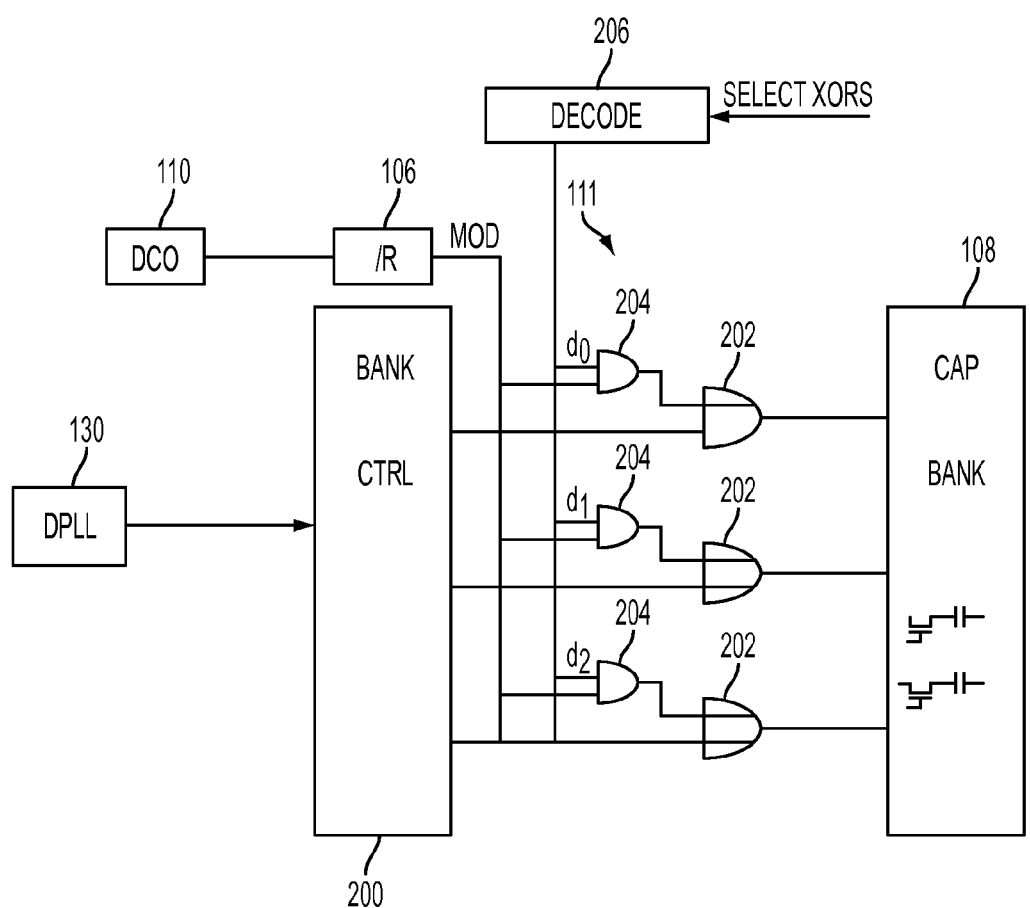
FIG. 2 is a block schematic of a capacitor bank and its control according to an exemplary embodiment.

The toggling of one capacitor in the capacitor bank 108 is preferably performed such that the DPLL 130 remains in lock, ensuring a fixed frequency of the main tone out of the DCO 110. FIG. 2, and the following paragraph describes how, for example, this can be accomplished.

On the right hand side of FIG. 2, the capacitor bank 108 is present; on the left hand side, the block controlling the capacitor bank is situated, which is part of the DPLL system 130. To enable the toggling of one capacitor, the inputs to the capacitor bank 108 are preceded by digital logic including XORs 202, which are driven by ANDs 204 and a decode block 206. With the decode block 206 and the ANDs 204, the capacitor to be enabled can be selected. Division by R of the DCO signal at block 106 derives a square wave modulation signal. This square wave modulation signal toggles the capacitors after the selected XOR 202 on/off. By making the modulation frequency high, compared to the loop bandwidth of the DPLL 130, the behavior of the DPLL 130 is not disturbed and it remains in lock. Alternatively, if the sidebands of the DCO carrier fall outside the IF bandwidth, the ATE 102 generator can be adjusted so that the sidebands fall inside the IF bandwidth.

As a purely illustrative example, the following parameters can be selected or obtained, for operating the exemplary DCO test equipment as described above and illustrated in FIGS. 1 and 2 as shown in Table 1.

TABLE 1

| | |
|---|---|
| Smallest step of BT modulation bank | 650 kHz |
| Choose $f_m$ | 1.3 MHz |
| Measurement time of CCR | 770 ns (one cycle of 1.3 MHz) |
| Sideband level | −18 dBc |
| DR of BT system in 1 MHz | 76 dB |
| signal to noise ratio (SNR) of main tone | ≈70 dB |
| SNR of sideband | 52 dB |

This results in an inaccuracy for the main tone of 0.16% and for the side band of 1.3% assuming 0.1 ppm chance of higher value then measured. Also, the inaccuracy of the relative value of the sideband compared to the main tone is then 1.3%. By increasing the measurement time to 77us (100 cycles of 1.3 MHz) it reduces noise by 20 dB and inaccuracy becomes 0.13%. Therefore, with 0.1 ppm chance of a false escape, the measurement time and the inaccuracy of the frequency step are: (1) measurement time 770 ns, inaccuracy 1.3%, and (2) measurement time 77us, inaccuracy 0.13%.

Exemplary embodiments provide for testing of DCOs 110 during a production test that is very quick as compared to conventional testing methods, with measurement accuracy that is high enough to verify linearity of the DCO 110. Exemplary embodiments also provide for simple on-chip implementations that do not require much space. The divider /R 106 can be dedicated to this test with the CCR 104 being used for multiple measurements. Additionally, requirements on additional circuitry are relatively low, for example, divider /R 106 can be a divider from a general use digital library and the CCR 104 can be a digital circuit including two multipliers and two integrators. According to exemplary embodiments, only the frequency $f_m$ needs to be accurate. Accurate frequency sources are readily available during production tests.

Figure 3:
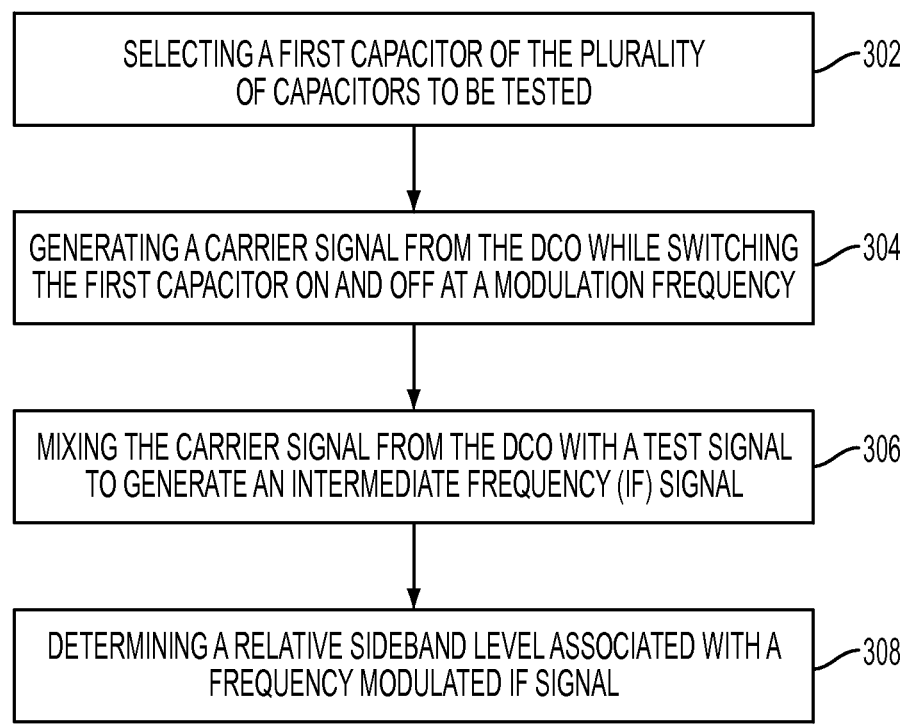
FIG. 3 is a flowchart illustrating a method according to exemplary embodiments.

An exemplary method for testing a plurality of capacitors within a digital controllable oscillator is illustrated in FIG. 3. Therein, at step 302 selecting a first capacitor of the plurality of capacitors to be tested; at step 304 generating a carrier signal from the DCO while switching the first capacitor on and off at a modulation frequency; at step 306 mixing the carrier signal from the DCO with a test signal to generate an intermediate frequency (IF) signal; and at step 308. determining a relative sideband level associated with a frequency modulated (FM) IF signal.

The above-described exemplary embodiments are intended to be illustrative in all respects, rather than restrictive, of the present invention. Thus the present invention is capable of many variations in detailed implementation that can be derived from the description contained herein by a person skilled in the art. No element, act, or instruction used in the description of the present application should be construed as critical or essential to the invention unless explicitly described as such. Also, as used herein, the article "a" is intended to include one or more items.

What is claimed is:

1. A test system for capacitors in a digitally controllable oscillator (DCO) comprising:
   capacitor toggling logic configured to switch on and off a selected one of the capacitors at a modulation frequency;
   a tone generator configured to generate a tone;
   a mixer configured to receive the tone and an output carrier signal from the DCO while the capacitor toggling logic is switching the selected one of the capacitors on and off, and to output an intermediate frequency signal having FM sidebands based on the modulation frequency and relative capacitor size; and
   an evaluation circuit configured to evaluate a frequency deviation associated with the selected one of the capacitors based on at least one of the FM sidebands.

2. The test system of claim 1, wherein the modulation frequency is generated by using a frequency source which is independent of the DCO.

3. The test system of claim 1, wherein the selected one of the capacitors is switched on and off when conditions of an XOR gate and an AND gate are met.

4. The method of claim 3, wherein selecting of the first capacitor is performed by a decoder.

5. The test system of claim 1, wherein the modulation frequency is selected such that a measured FM sideband value is approximately −20 dBc.

6. A method for testing a plurality of capacitors within a digital controllable oscillator (DCO), the method comprising:
   selecting a first capacitor of the plurality of capacitors to be tested;

generating a carrier signal from the DCO while switching the first capacitor on and off at a modulation frequency;

mixing the carrier signal from the DCO with a test signal to generate an intermediate frequency (IF) signal; and determining a relative sideband level associated with a frequency modulated (FM) IF signal.

7. The method of claim 1, further comprising:

generating the modulation frequency by dividing a frequency of the DCO by a divider.

8. The method of claim 7, further comprising:

deselecting the first capacitor; and selecting a second capacitor.

9. The method of claim 8, wherein when the second capacitor has a different capacitance from the first capacitor the value of the divider is changed such that the FM sideband level remain substantially unchanged.

10. The method of claim 6, further comprising:

generating the modulation frequency using a frequency source which is independent of the DCO.

11. The method of claim 6, wherein the selected first capacitor is switched on and off when conditions of an XOR gate and an AND gate are met.

12. The method of claim 11, wherein selecting of the first capacitor is performed by a decoder.

13. The method of claim 6, wherein the modulation frequency is selected such that a measured FM sideband value is approximately −20 dBc.

14. A digital controllable oscillator (DCO) manufactured by the process comprising the steps of:

selecting a first capacitor of the plurality of capacitors to be tested;

generating an output signal from the DCO associated with the first capacitor;

mixing the output signal from the DCO with a test signal; and evaluating a frequency deviation of a frequency modulated (FM) sideband of the first capacitor.

15. The DCO manufactured by the process of claim 14, wherein the process further comprises:

generating the modulation frequency by dividing a frequency of the DCO by a divider.

16. The DCO manufactured by the process of claim 15, wherein the process further comprises:

deselecting the first capacitor; and selecting a second capacitor.

17. The DCO manufactured by the process of claim 16, wherein when the second capacitor has a different capacitance from the first capacitor the value of the divider is changed such that the FM sideband level remains substantially unchanged.

18. The DCO manufactured by the process of claim 14, wherein the process further comprises:

generating the modulation frequency using a frequency source which is independent of the DCO.

19. The DCO manufactured by the process of claim 14, wherein the selected first capacitor is switched on and off when conditions of an XOR gate and an AND gate are met.

20. The DCO manufactured by the process of claim 19, wherein selecting of the first capacitor is performed by a decoder.

* * * * *